US011415880B2

(12) United States Patent
Lane et al.

(10) Patent No.: US 11,415,880 B2
(45) Date of Patent: Aug. 16, 2022

(54) NANOIMPRINT LITHOGRAPHY MATERIAL WITH SWITCHABLE MECHANICAL PROPERTIES

(71) Applicant: Facebook Technologies, LLC, Menlo Park, CA (US)

(72) Inventors: Austin Lane, Redmond, WA (US); Matthew E. Colburn, Woodinville, WA (US); Giuseppe Calafiore, Redmond, WA (US); Nihar Ranjan Mohanty, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 135 days.

(21) Appl. No.: 16/252,564

(22) Filed: Jan. 18, 2019

(65) Prior Publication Data

US 2019/0346760 A1 Nov. 14, 2019

Related U.S. Application Data

(60) Provisional application No. 62/669,212, filed on May 9, 2018.

(51) Int. Cl.
*G03F 7/00* (2006.01)
*G03F 7/027* (2006.01)
(Continued)

(52) U.S. Cl.
CPC ............ *G03F 7/0002* (2013.01); *G03F 7/027* (2013.01); *G03F 7/0043* (2013.01); *G03F 7/16* (2013.01);
(Continued)

(58) Field of Classification Search
CPC .............................. G03F 7/0002; G03F 7/027
See application file for complete search history.

(56) References Cited

U.S. PATENT DOCUMENTS

2004/0137734 A1    7/2004  Chou et al.
2006/0255505 A1 * 11/2006  Sandhu ................... B82Y 10/00
                                                        264/293
(Continued)

OTHER PUBLICATIONS

Lan et al, "UV-nanoimprint lithography: structure, materials and fabrication of flexible molds", 2013, Journal of nanoscience and nanotechnology, 13, No. 5, 2013: 3145-3172, all pages in particular, highlighted portions in pp. 3154, 3160, 3162, 3163, and 3169. (Year: 2013).*

(Continued)

*Primary Examiner* — Jerzi H Moreno Hernandez
(74) *Attorney, Agent, or Firm* — Fenwick & West LLP

(57) ABSTRACT

A method is described for utilizing NIL materials with switchable mechanical properties. The method comprises applying an imprint mask to a nano-imprint lithography (NIL) material layer. The NIL material layer is comprised of a NIL material with a modulus level below a flexibility threshold. The NIL material layer has an internal property, that when changed, causes a change in the modulus level of the NIL material. The method further comprises detaching the imprinted NIL material layer from the imprint mask, with the low modulus level of the NIL material causing a shape of the imprinted NIL material layer to remain unchanged after detachment. A modulus level of the NIL material is increased by changing an internal property of the NIL material, with the modulus level increased beyond a strength threshold to create a first imprint layer that has a structure that remains unaffected by a subsequent process.

6 Claims, 6 Drawing Sheets

(51) Int. Cl.
*G03F 7/20* (2006.01)
*G03F 7/004* (2006.01)
*G03F 7/16* (2006.01)
*G03F 7/36* (2006.01)

(52) U.S. Cl.
CPC .............. *G03F 7/2002* (2013.01); *G03F 7/36* (2013.01); *G03F 7/70491* (2013.01)

(56) References Cited

U.S. PATENT DOCUMENTS

| | | | |
|---|---|---|---|
| 2007/0252293 A1 | 11/2007 | Sato et al. | |
| 2008/0204684 A1* | 8/2008 | Cho | B05D 5/02 355/53 |
| 2008/0274323 A1 | 11/2008 | Raby et al. | |
| 2009/0224416 A1* | 9/2009 | Laakkonen | G02B 5/1852 264/1.38 |
| 2009/0256287 A1* | 10/2009 | Fu | G03F 7/0757 264/447 |
| 2009/0264317 A1* | 10/2009 | Ofir | B82Y 10/00 506/16 |
| 2011/0084424 A1* | 4/2011 | Kaida | B29C 33/56 264/293 |
| 2011/0183027 A1* | 7/2011 | Miller | G03F 7/0002 425/385 |
| 2012/0141738 A1* | 6/2012 | Miyake | G03F 7/0002 428/156 |
| 2012/0183690 A1 | 7/2012 | Titulaer | |
| 2013/0200553 A1 | 8/2013 | Yamada et al. | |
| 2017/0259461 A1* | 9/2017 | Rolland | B29C 43/222 |
| 2018/0088468 A1* | 3/2018 | De Schiffart | G03F 7/0002 |
| 2019/0031939 A1 | 1/2019 | Villalpando-Paez et al. | |
| 2019/0227429 A1 | 7/2019 | Yang et al. | |
| 2019/0346759 A1* | 11/2019 | Lane | G03F 7/039 |

OTHER PUBLICATIONS

United States Office Action, U.S. Appl. No. 16/252,565, filed Dec. 24, 2020, seven pages.
United States Office Action, U.S. Appl. No. 16/252,565, filed Apr. 1, 2021, seven pages.
Final Office Action dated Oct. 22, 2021 for U.S. Appl. No. 16/252,563, filed Jan. 18, 2019, 8 pages.
Non-Final Office Action dated Jun. 8, 2021 for U.S. Appl. No. 16/252,563, filed Jan. 18, 2019, 11 pages.
Yadav A., "Nanoimprinting Techniques for Polymeric Electronic Devices," Dissertation, Technical University of Munich, 2014, 155 pages.

* cited by examiner

NANOIMPRINT LITHOGRAPHY MATERIAL WITH SWITCHABLE MECHANICAL PROPERTIES

CROSS REFERENCE TO RELATED APPLICATIONS

This application claims the benefit of U.S. Provisional Application No. 62/669,212, filed May 9, 2018, which is incorporated by reference in its entirety.

FIELD OF ART

The disclosure generally relates to the field of nanoimprint lithography (NIL), and specifically to NIL materials with switchable mechanical properties.

BACKGROUND

Nano-imprint lithography (NIL) is a process whereby nanometer scale patterns are imprinted, using mechanical processes, on an imprint material. These patterns may be three dimensional in shape (i.e., vary along three different axes). Such patterned materials may have many applications (e.g., for use to channel fluids, act as waveguides, be used for circuit patterns), and in some cases, are manufactured at a cost that is lower than optical lithography. Commonly, these patterns may be created by imprinting the NIL material with a negative mask, i.e., a mold that has an inverse pattern of the desired pattern. After imprinting the NIL material with the mask, the pattern is formed on the NIL material, and the NIL material may then be cured and passed through additional processing steps.

Ideally, when applying the mask, an NIL material with higher flexibility (i.e., lower Young's modulus) is used, so that the application of the mask does not cause the NIL material to fracture or break, especially when the mask is removed from the NIL material. However, such a flexible material is not ideal during later processing steps. For these later processing steps, an NIL material with a high strength, and low flexibility, is desired instead. These materials may be more resilient during subsequent steps, such as curing.

Therefore, a problem exists in NIL with existing NIL material. The existing NIL material has a fixed modulus. However, during the NIL process, it is desirable to have NIL material with low modulus during the initial imprint process, but with high modulus during later post-processing steps.

SUMMARY

Embodiments relate to utilizing NIL materials with switchable mechanical properties. An imprint mask is applied to a nano-imprint lithography (NIL) material layer to create an imprinted NIL material layer. The NIL material layer is comprised of a NIL material with a modulus level below a flexibility threshold. The NIL material layer has an internal property, that when changed, causes a change in the modulus level of the NIL material. The imprinted NIL material layer is detached from the imprint mask, with the low modulus level of the NIL material causing a shape of the imprinted NIL material layer to remain unchanged after detachment. A modulus level of the NIL material is increased by changing an internal property of the NIL material, with the modulus level increased beyond a strength threshold to create a first imprint layer that has a structure that remains unaffected by a subsequent process to form a second imprint layer.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Embodiments here disclose a method and system for solving the problem regarding the desire to have NIL material which can have switchable mechanical properties. A method is described for using materials with characteristics that can be modified to induce changes in the mechanical properties of those materials. An imprint mask is applied to a nano-imprint lithography (NIL) material layer to create an imprinted NIL material layer. The NIL material layer is comprised of a NIL material with a modulus level below a flexibility threshold. The NIL material layer has an internal property, that when changed, causes a change in the modulus level of the NIL material. The imprinted NIL material layer is detached from the imprint mask, with the low modulus level of the NIL material causing a shape of the imprinted NIL material layer to remain unchanged after detachment. A modulus level of the NIL material is increased by changing an internal property of the NIL material, with the modulus level increased beyond a strength threshold to create a first imprint layer that has a structure that remains unaffected by a subsequent process to form a second imprint layer.

Exemplary Processes Using NIL Materials with Switchable Mechanical Properties

Figure 1:
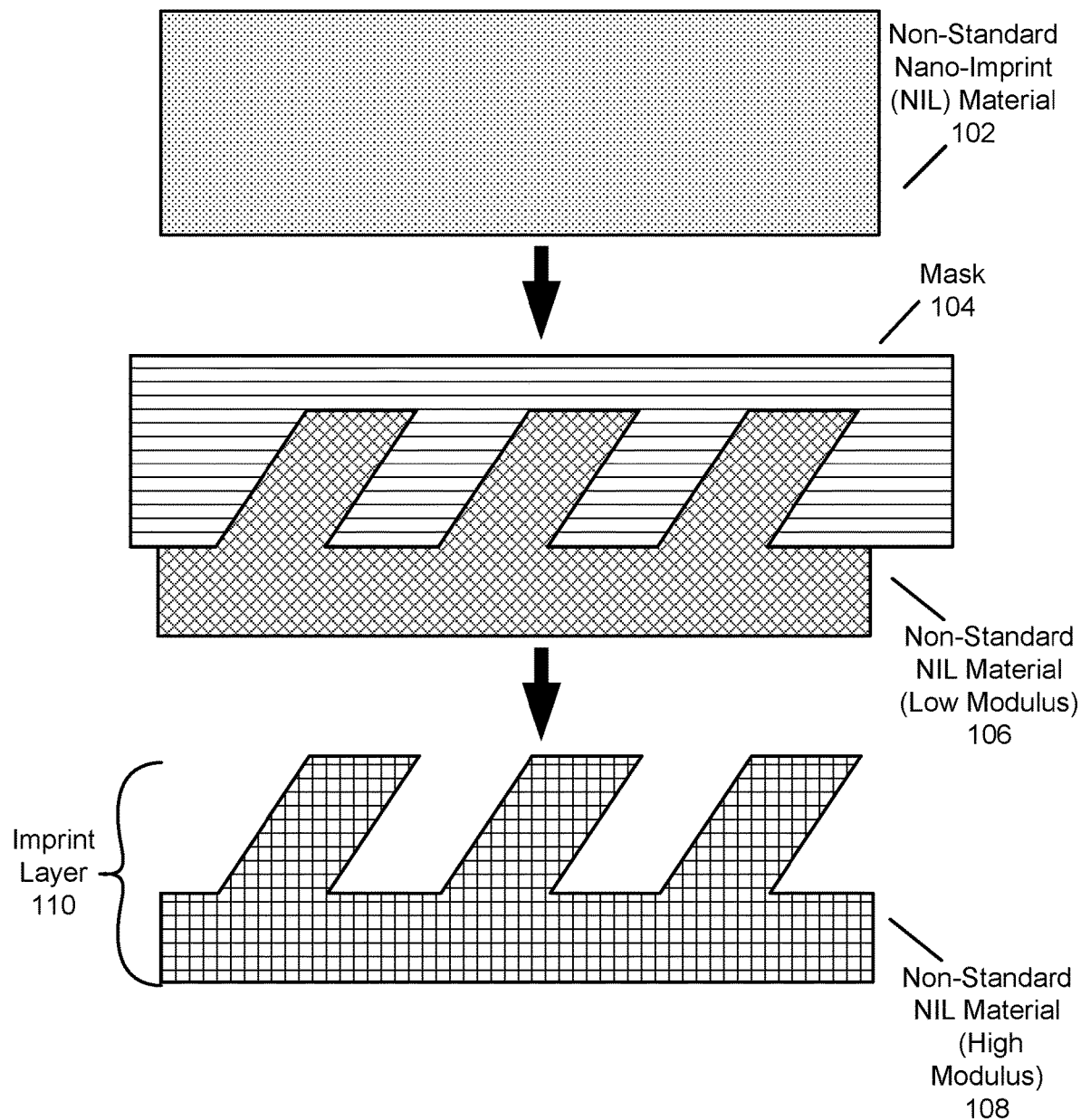
FIG. 1 illustrates an example of a process using NIL materials with switchable mechanical properties, according to an example embodiment.

FIG. 1 illustrates an example of a process using NIL materials with switchable mechanical properties, according to an example embodiment.

Figure 2:
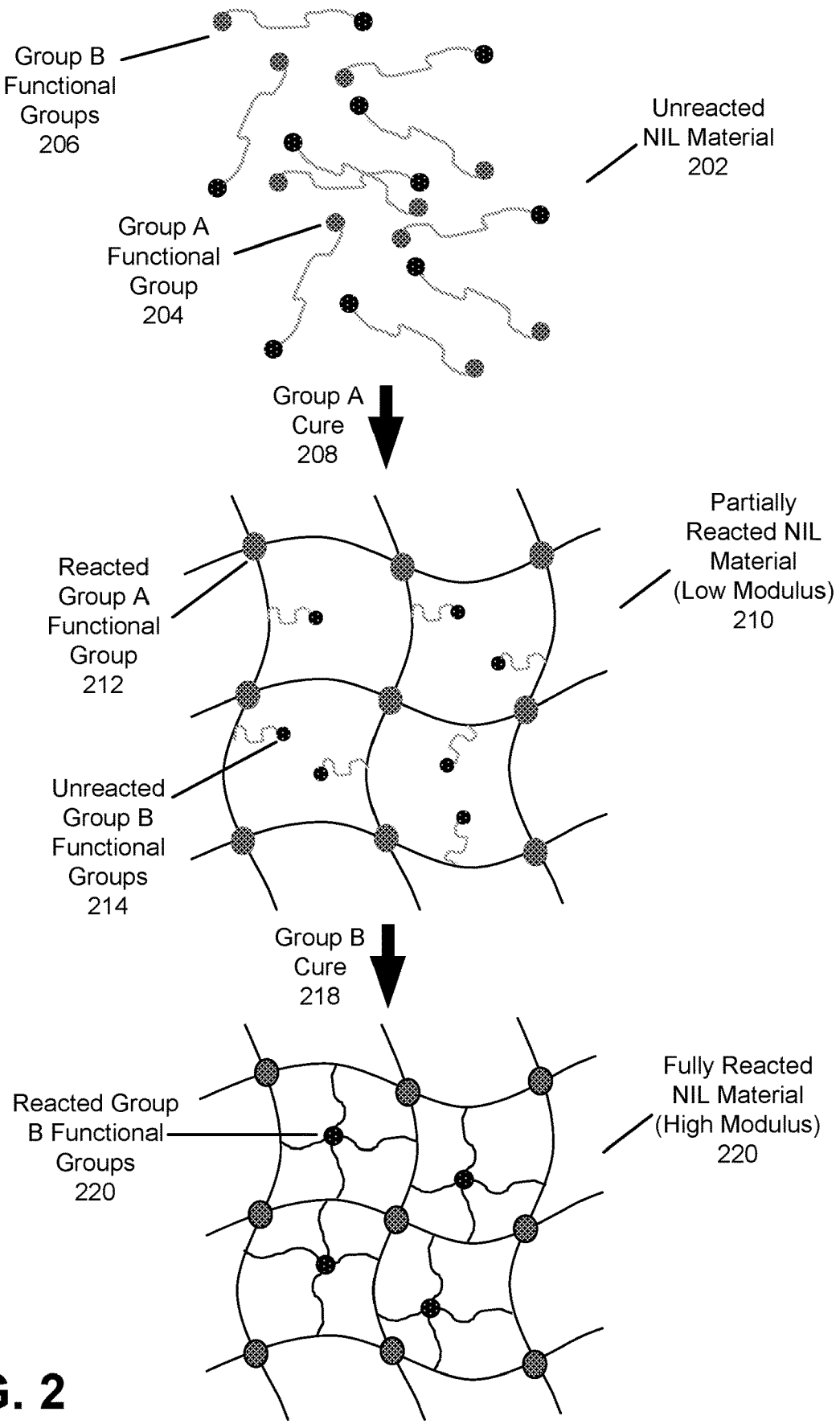
FIG. 2 illustrates a NIL material with bifurcated functional group types having different reaction stimuli, according to an embodiment.
Figure 3:
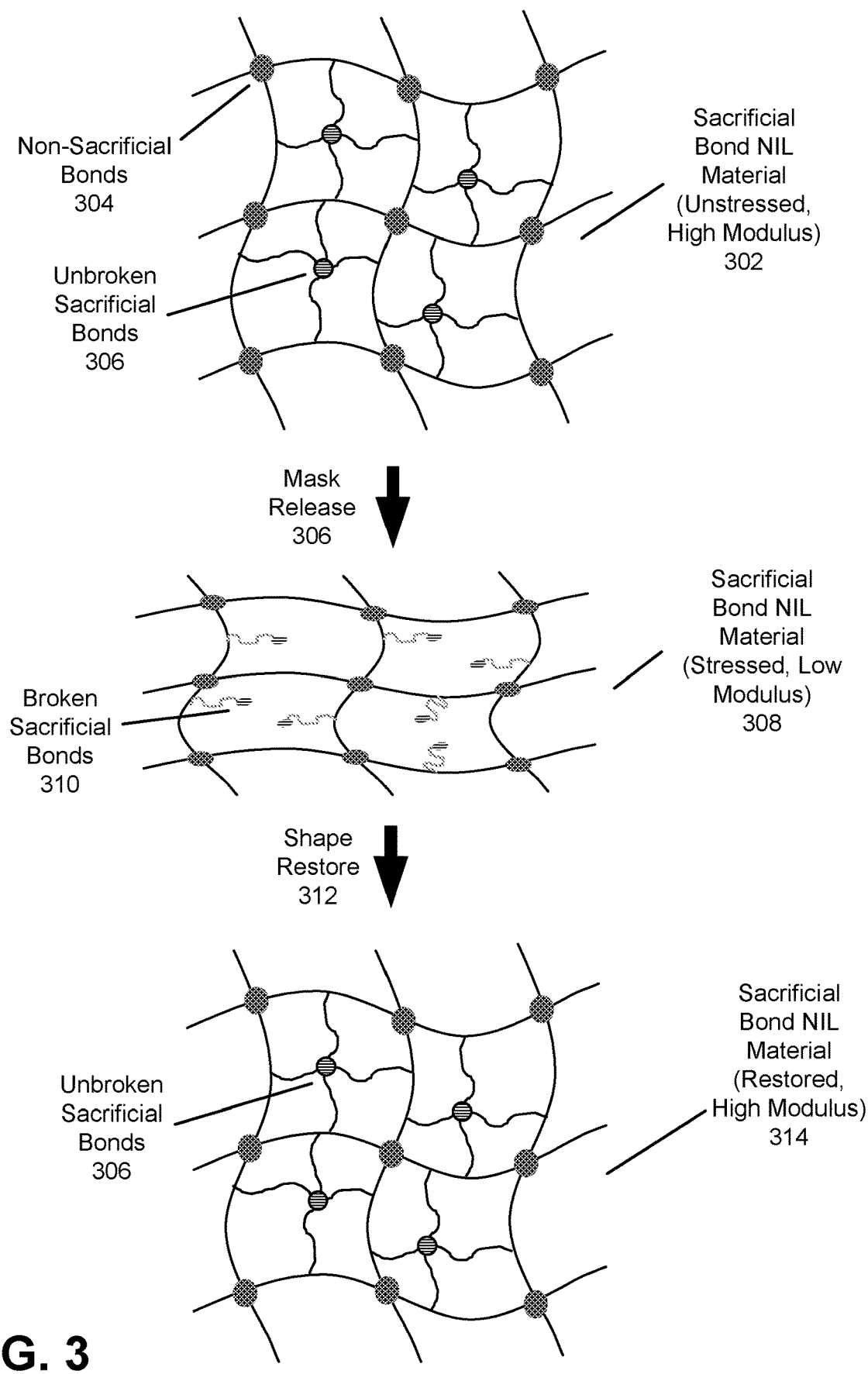
FIG. 3 illustrates a NIL material with sacrificial bonds capable of being broken and rejoined, according to an embodiment.
Figure 4:
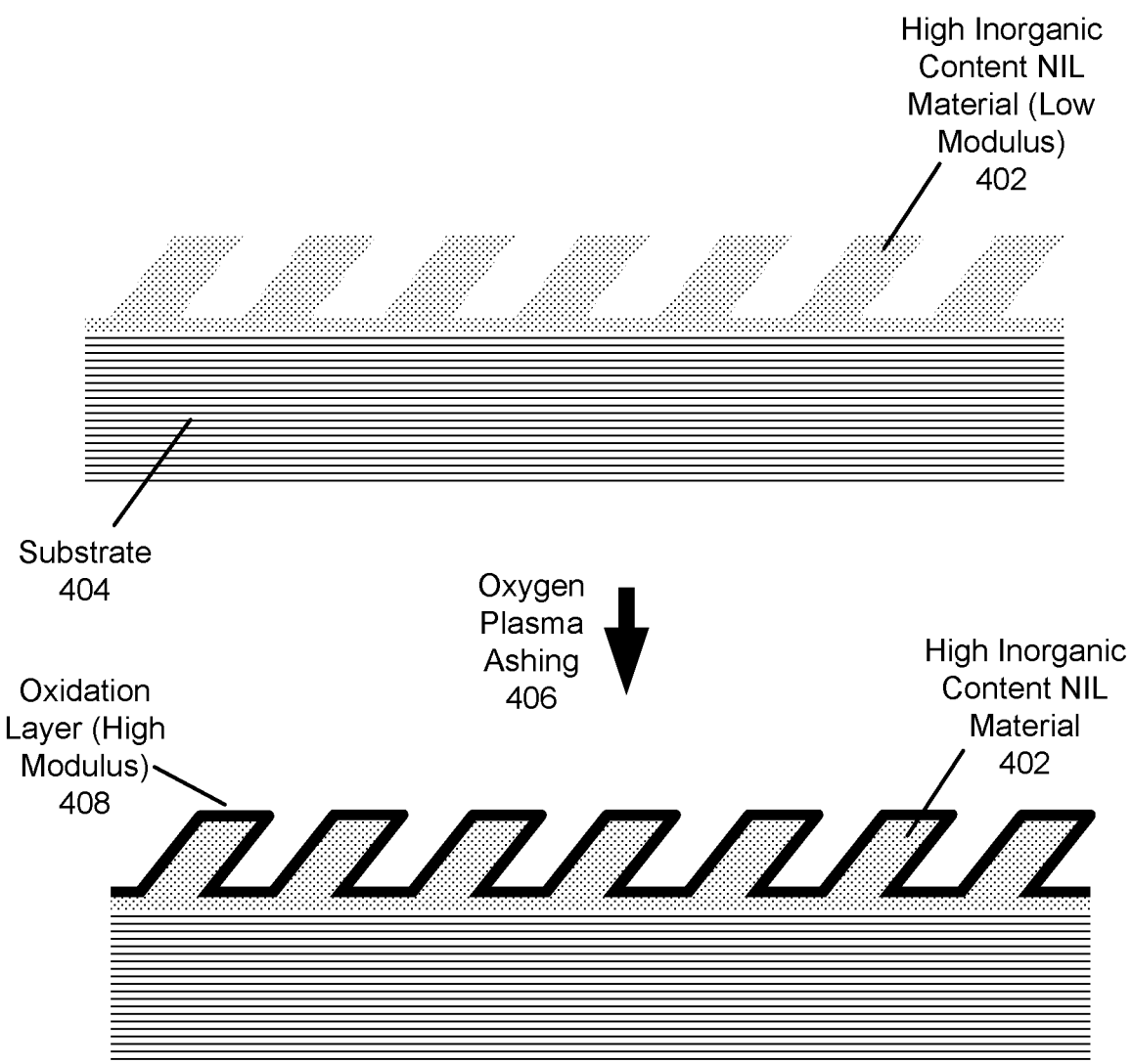
FIG. 4 illustrates a NIL material with high inorganic content capable of forming an oxidation layer via plasma ashing, according to an embodiment.

During an initial imprint phase, whereby a mask 104 is imprinted on the NIL material 102, a more flexible NIL material is desired, because a stiffer material may break when the NIL material is released from the mask 104. However, during later processing steps, a stiffer NIL material is desired. NIL material that is flexible may suffer from feature collapse during these post processing steps, i.e., the features on the imprinted NIL material may be changed during the post processing phase in an undesired fashion. Therefore, NIL material which has switchable mechanical properties is desirable. FIG. 1 illustrates a general outline of a process whereby the mechanical properties of NIL material used for imprinting is changed during the imprinting process. This allows the modulus of the NIL material to be changed during the imprinting process. The additional FIGS. 2-4 illustrate exemplary types of NIL material with such switchable mechanical properties. The general process shown in FIG. 1 may be simplified from the actual ML process, such that additional preparation, post-processing, and intermediary steps may be omitted for sake of clarity. The imprinting process shown in FIG. 1 may be performed by an imprinting system, such as the NIL system 500 illustrated in FIG. 5.

The imprinting process begins with a layer of non-standard NIL material 102. This material may be any material capable of being imprinted, and may differ based on the curing method. For example, a thermally cured process may utilize a thermoplastic polymer as the non-standard NIL material 102, while an ultraviolet (UV) curing process may use a photo curable liquid resist as the non-standard NIL material 102. However, in contrast to standard NIL materials, as described with further detail below, the non-standard NIL material 102 includes additional compositions of components within that cause it to have different chemical and/or physical characteristics. These characteristics allow the material to have the ability to have switchable mechanical properties, either inherently, or from the application of an external influence.

A mask 104 (i.e., a mold) is applied to the non-standard NIL material 102 using physical force. This creates a layer of imprinted non-standard NIL material 106. The mask 104 displaces portions of the non-standard NIL material 102 to form a pattern that is an inverse of the pattern of the mask 104. Portions of the non-standard NIL material 102 may migrate to fill openings within the pattern of the mask 104. This allows for the creation of three dimensional patterns, i.e., patterns which vary in three dimensions. For example, a profile view of a three dimensional slanted pattern is illustrated in FIG. 1. After the application of the mask 104, the non-standard NIL material 102 becomes the imprinted non-standard NIL material 106.

The mask 104 is subsequently released from the imprinted non-standard ML material 106. When the mask 104 is released, the imprinted non-standard NIL material 106 has a modulus below a low modulus threshold value (e.g., <500 Mpa). This threshold value is a point at which the mask 104, when released from the imprinted non-standard NIL material 106, results in a breakage of the imprinted non-standard NIL material 106 below a threshold percentage (e.g., breakage only in 0.1% of cases), i.e., the imprinted non-standard NIL material 106 is not likely to break when the mask 104 is released. If the imprinted non-standard NIL material 106 had a higher modulus, then it would be stiffer, and the release of the mask 104 from the non-standard NIL material 106 would cause breakage of the non-standard NIL material 106 in a percentage of cases that would cause manufacturing yields to fall below an acceptable level.

The imprinted non-standard NIL material 106 has properties that differ from NIL material used in standard imprint processes. These properties allow the modulus of the non-standard NIL material 106 to be changed due to an external influence, or as an inherent property of the non-standard NIL material 106. Therefore, after imprinting, the NIL material 106 may become the non-standard NIL material 108 with a high modulus. This high modulus level may be a modulus level beyond a high modulus threshold value (e.g., >1 Gpa). In one embodiment, the non-standard NIL material 106 has two different types of functional groups that react to different types of curing methodologies, and therefore can have two different levels of stiffness. In another embodiment, the non-standard NIL material 106 contains sacrificial bonds which can release and rejoin upon application of physical stress. In another embodiment, the non-standard NIL material 106 includes a high concentration of inorganic compounds which react to a plasma ashing process by generating an oxidation layer, which increases the stiffness of the NIL material. These various non-standard NIL materials will be described below in further detail with reference to FIGS. 2-4.

Various post processing steps may subsequently be applied to the imprint layer containing the high modulus NIL material 108, such as overcoating, high temperature annealing, etching, plasma application, and so on. As the NIL material 108 is of a high modulus, it is less likely to suffer from feature collapse of the imprinted pattern during these post-processing steps. This results in a more accurate pattern at conclusion of the NIL process, resulting in a more accurate product to be used in various applications. For example, if the NIL material is to be used as a waveguide grating, its optical properties will adhere more closely to design specifications by using the process described here as feature collapse is minimized, while also achieving high yields during the imprinting process due to reduction of breakage of the NIL material during release of the mask.

NIL Material with Multiple Functional Group Types

FIG. 2 illustrates a NIL material with bifurcated functional group types having different reaction stimuli, according to an embodiment. As shown in FIG. 2, the NIL material 202 may begin in a completely unreacted state. This NIL material 202 may have a very low or zero modulus, and may not be in a solid form, e.g., it may be a liquid with high viscosity. The unreacted NIL material 202 may be spin coated or applied in some other fashion to a substrate. Unlike standard NIL materials, the NIL material 202 has two or more types of functional groups. Each of these types of functional groups is reacted, i.e., cured, using a method that does not affect the curing of the other functional group in the NIL material 202. For example, one functional group may be cured using ultraviolet (UV) light of one wavelength, while the other functional group may be cured using UV light of a different wavelength. As another example, one functional group may be cured by thermal energy, while the other functional group may be cured by UV light. In addition, the different types of functional groups within the NIL material 202 may cross-link with each other when both are cured, i.e., polymers from one functional group will link to polymers from another functional group. This cross-linking may occur with the use of a photo or thermal catalyst, a vapor-phase reaction between a polymer network and a bridging molecule such as epoxide and diamine, and/or dimerization reaction catalyze by EM radiation.

In the illustrated example, the NIL material 202 has two functional groups, group A 204 and group B 206. Prior to the release of the mask, e.g., the mask 104, from the NIL material 202, one of these functional groups is fully cured/reacted. For example, as shown, a group A cure 208 is performed to cure the group A functional groups, resulting in the partially reacted NIL material 210, with reacted group A functional groups 212 but unreacted group B functional groups 214. At this point, the partially reacted NIL material 210 may still have a low modulus level below the low modulus threshold level. Therefore, when the mask is released from the NIL material 210, the chance of breakage is low. Subsequently, after release of the mask, the NIL material 210 undergoes additional curing of the other unreacted functional group in the NIL material 210, in this case the unreacted group B functional groups 214, in the group B cure 218. The group B cure 218 may also apply a cross-linking process to the NIL material 210, in order to cross-link the two functional groups in the NIL material 210. This results in a fully reacted NIL material 220, which, due to the polymerization of all the functional groups within the material, and due to the cross-linking of the different polymerized functional groups, now has a modulus level above the high modulus threshold value.

Examples of one type of functional group (e.g., group A) include acrylates, methacrylates, epoxides, vinyl ethers, and thiols in combination with alkene groups. Examples of complementary types to the above-listed types include acrylates, methacrylates, epoxides, vinyl ethers, thiols in combination with alkene groups, photodimerizing groups including cinnamates, coumarin, etc., thermally dimerizing groups including Diels-Alder adducts, and cyclopentadiene-alkyne groups. Other combinations of two different types of functional groups include epoxide/anhydride and infusion of amine and alcohol/amine and infusion of dialdehyde.

NIL Material with Sacrificial Bonds

FIG. 3 illustrates a NIL material with sacrificial bonds capable of being broken and rejoined, according to an embodiment. In contrast to the NIL material 202 of FIG. 2, in FIG. 3 the NIL material 302 has a composition which includes standard functional groups with non-sacrificial bonds 304, as well as functional groups with sacrificial bonds 306 (shown here in an unbroken state). These sacrificial bonds 306 break at a level of force that is lower than the level of force needed to break the non-sacrificial bonds 304. Furthermore, once the force is removed, the sacrificial bonds 306 may rejoin together and restore back to an original state. Examples of such sacrificial bonds are hydrogen bonds. These sacrificial bonds are likely to be non-covalent, as covalent bonds have a stronger bond energy. In addition, when in the bound state, the sacrificial bonds increase the modulus of the NIL material 302 beyond the high modulus threshold value. When in the broken state, the sacrificial bonds do not contribute (or contribute very little) to the stiffness of the NIL material 302, and the stiffness contributed by the non-sacrificial bonds 304 may be measured as a modulus level that is below the low modulus threshold value.

As shown in FIG. 3, the sacrificial bond NIL material 302 has already been imprinted with the mask 104. After imprinting but before release of the mask 104, the functional groups having the non-sacrificial bonds 304 may be cured. Alternatively, the functional groups having the non-sacrificial bonds 304 may already have been cured prior to the imprinting of the mask 104. At this point, the mask 104 is released 306 from the NIL material 302. During this release process, the physical force exerted upon the NIL material 302 is sufficient to cause the sacrificial bonds 310 to break, but does not cause the non-sacrificial bonds 304 to break, as the non-sacrificial bonds 304 may have a higher bond energy compared to the sacrificial bonds 310. At this point, the NIL material 308 also has low modulus, as only the non-sacrificial bonds 304 are bound, and the sacrificial bonds 310 are broken, reducing the structural connections within the NIL material 308, and thus its stiffness as well.

After the mask 104 is fully released, the shape of the NIL material 308 is restored 312 to form the NIL material 314. The sacrificial bonds 306 are reset to an unbroken state, and combined with the non-sacrificial bonds 304, the modulus level of the NIL material 314 is once again of a high modulus, e.g., beyond the high modulus threshold value. This high modulus NIL material 314 may undergo additional post-process steps, as described below with reference to FIG. 5.

Examples of NIL materials which have sacrificial bonds include materials which form hydrogen bonds from urethane, urea, ester, carbonate, amine, amide, carboxylic acid, or hydroxyl groups. Other examples of materials with sacrificial bonds include materials with "supramolecular" chemistries, such as metal coordination bonds (iron/catechol), and materials with charge transfer interactions (bipyridinium/arenes). In addition, the sacrificial bonds may be formed based on physical polymer interactions rather than chemical bonds. These types of bonds may include physical crosslinks from block copolymer self-assembly or interlocking molecular architectures, such as rotaxanes and catenanes.

NIL Material with High Inorganic Content

FIG. 4 illustrates a NIL material with high inorganic content capable of forming an oxidation layer via plasma ashing, according to an embodiment. As shown in FIG. 4, the NIL material 402 has a high inorganic material content, such as silicon or titanium. The inorganic material may comprise more than a threshold percentage (e.g., 15%) of the NIL material 402 by mass, and may be distributed evenly throughout the NIL material 402, or may be concentrated near the surface of the NIL material 402.

Upon exposure to oxygen plasma, in an oxygen plasma ashing 406 process, the high inorganic content NIL material 402 forms an oxidation layer 408 on the surface of the high inorganic content NIL material 402 where it comes into contact with the oxygen plasma. The NIL material 402 may be exposed after the mask is imprinted and released from it. No additional material is deposited on the NIL material 402 to form the oxidation layer 408. Instead, the inorganic material within the NIL material 402 which comes into contact with the oxygen plasma oxidizes to form oxides such as $SiO_2$ or $TiO_2$. The oxidation layer 408 has a higher modulus compared to the NIL material 402 itself. Furthermore, the crosslink density at the surface of the NIL material 402 (i.e., the surface which has the oxidation layer 408) is also increased. This may increase the effective modulus level of the combined layer of NIL material 402 and oxidation layer 408 beyond the high modulus threshold value. In addition, the oxidation layer is less soluble to organic solvents compared to the NIL material 402. This can reduce the swelling and distortion of nano-features of the imprinted layer of NIL material 402 in the presence of organic solvents, which may be applied later in a post-processing step.

Examples of NIL materials 402 with high inorganic content include siloxanes, silsesquioxanes, and silicon/titanium functionalized acrylates and epoxides.

Figure 5:
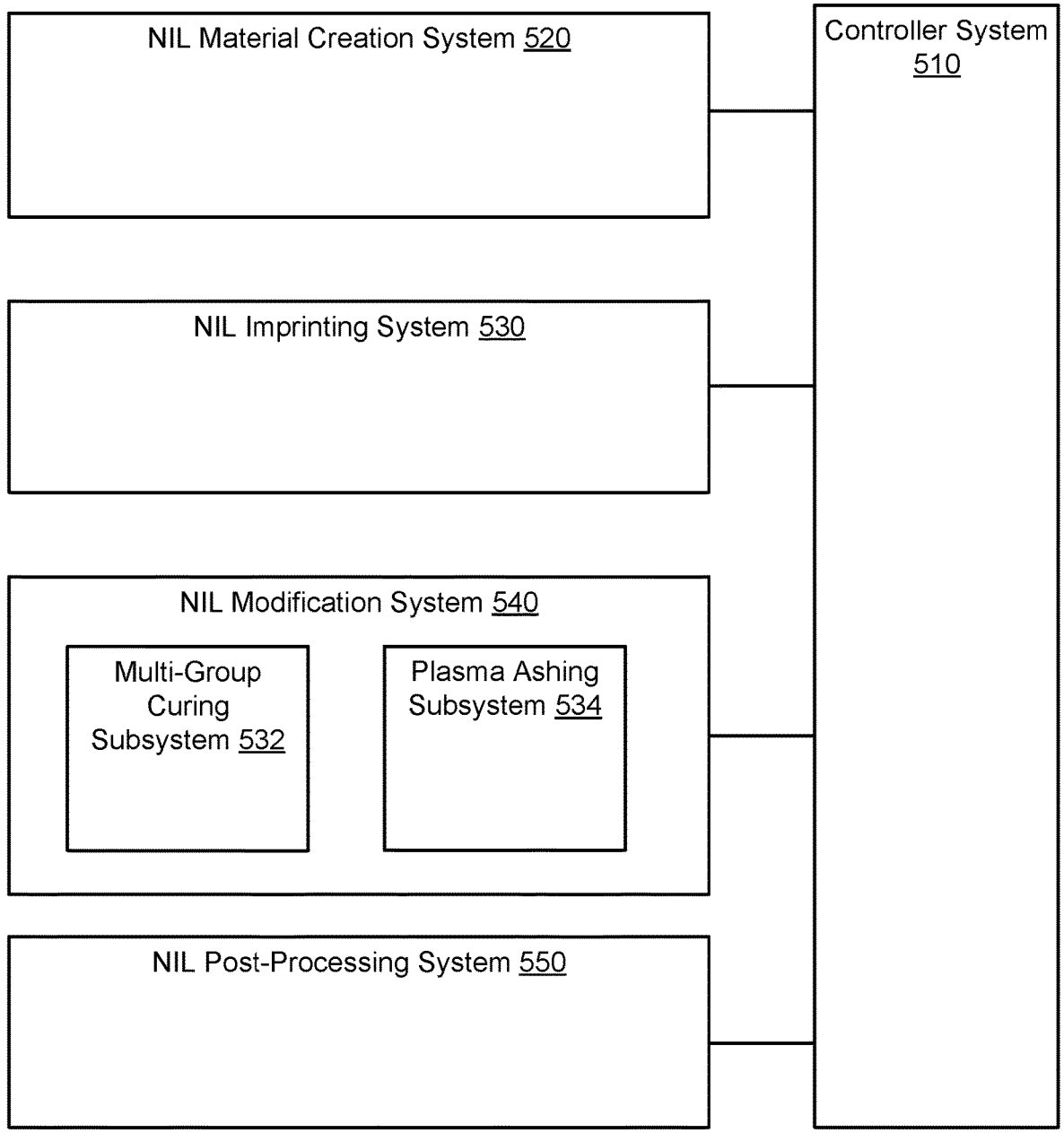
FIG. 5 illustrates an exemplary system 500 for nanoimprint lithography using switchable NIL materials, according to an embodiment.

Exemplary System for Nano Imprint Lithography Using NIL Materials with Switchable Mechanical Properties FIG. 5 illustrates an exemplary NIL system 500 for nano-imprint lithography and NIL material modification, according to an embodiment. The NIL system 500 includes a controller 510, a NIL material creation system 530, a NIL imprinting system 540, a NIL material modification system 540, and an NIL post-processing system 550. Although certain elements are shown in the NIL system 500, in other embodiments the system 500 includes other elements, and the processes performed by the elements may differ from those shown in NIL system 500 and described here.

The controller 510 generates instructions for the NIL material creation system 520, the NIL imprinting system 530, the NIL material modification system 540, and the NIL post-processing system 550, in order to create the non-standard NIL material, and to create the imprinted NIL material with post-processing from an initially unprocessed NIL material. The instructions generated by the controller 510 may be based on various configuration settings provided by an administrator or other system (e.g., a semiconductor fabrication system). These configuration settings may include a type of pattern to be imprinted, a type of NIL material to be used, post-processing options to be applied, mask material to be used, substrate material to be used, and other materials to be used in the imprinting process, and so on. Based on these configuration options, the controller 510 transmits instructions to the various systems 520, 530, 540, and 550 to instruct these systems on what materials to use, what processes to execute, when to execute these processes, and so on, in order to create the final imprinted NIL material according to the configuration settings.

For example, the controller 510 may send a set of etching instructions to the NIL imprinting system 530 to create a master mold according to an imprinting pattern and to create a mask using the master mold, with the mask having an inverse pattern of the imprinting pattern. As another example, if the configuration options include UV curing, the controller 510 may transmit instructions to the NIL imprinting system 530 to activate a UV light source against the NIL imprint material at a certain intensity for a certain duration.

The NIL material creation system 520, based on instructions from the controller 510, may create the non-standard NIL materials described above with reference to FIGS. 2-4. In one embodiment, the NIL material creation system 520 receives instructions to create an ML material, such as NIL material 202, with two different types of functional groups. To create this NIL material, the NIL material creation system 520 may mix NIL materials from two different sources having compatible functional groups together. The NIL materials have compatible functional groups if the functional groups can cross-link orthogonally. One of these functional groups may be specified in the instructions from the controller 510. The proportion of each NIL material that is used may be based on instructions from the controller 510, may be evenly divided, or may be based on the properties of the functional groups (e.g., the proportion may be specified based on the ratio of cross-linking between units of one functional group and the second functional group).

In one embodiment, the NIL material creation system 520 receives instructions to create an NIL material, such as NIL material 302, which includes functional groups with sacrificial bonds. Similar to the case of the NIL material 202 with different types of functional units, the NIL material creation system 520 may also combine NIL materials from two different sources, with one NIL material having non-sacrificial bonds, and the other NIL material having sacrificial bonds which can break and then be reset.

In one embodiment, the NIL material creation system 520 receives instructions to create an NIL material with high inorganic content, such as NIL material 402. In such a case, the NIL material creation system 520 may create the NIL material 402 by retrieving it from a source of NIL material that has the high inorganic content already included, or may combine standard NIL material with inorganic compounds such that the inorganic compounds are evenly mixed with the NIL material and comprise at least a certain percentage of the NIL material by weight or volume, sufficient to allow the NIL material to form the oxidation layer when exposed to oxygen plasma.

The NIL imprinting system 530, based on instructions from the controller 510, imprints the NIL material with a pattern using a mask to create an imprint layer that includes the NIL material imprinted with the pattern from the mask. The NIL imprinting system 530 may receive instructions on the creation of the mask, such as the mask 104. These instructions may indicate the type of material to use for a master mold and a type of material to use for the mask, which is created as an inverse pattern of the pattern of the master mold. The instructions also include the type of pattern to be created. This may be specified using a three dimensional coordinate system, e.g., as a polygonal mesh, or as a set of instructions for using various material removal tools (e.g., etching, ablation) to remove material from a block of the master mold material in a specific sequence, with a specific amount, and so on, to create the pattern of the master mold. The NIL imprinting system 530 may apply the material indicated in the instructions, as well as the instructions for the pattern, in order to create the master mold. The NIL imprinting system 530 subsequently applies the master mold to a material specified by the instructions as the material for the mask.

To apply the mask to a layer of NIL material, such as NIL material 102, the NIL imprinting system 530 may form a layer of the NIL material, using a deposition method such as spin coating, on a substrate. The NIL imprinting system 530 may then apply the mask to the NIL material layer. The application force, duration, speed, and other parameters may be specified by the instructions from the controller 510, or based upon the type of pattern desired and materials being used. These instructions may apply to both the application and release of the mask from the NIL material. After imprinting the mask upon the NIL material, the NIL material modification system 540 may be utilized to modify the NIL material, depending upon the type of NIL material that is used. This creates a layer of NIL material that has been imprinted with the imprint pattern of the mask. This imprint layer may undergo additional post-processing steps by the NIL post-processing system 550, in order to create a final imprint layer.

The NIL material modification system 540 receives instructions from the controller 510 to apply various modifications to the NIL material under imprint in order to change the mechanical properties of the NIL material. In one embodiment, the NIL material modification system 540 includes a multi-group curing subsystem 532 and a plasma ashing subsystem 534.

The multi-group curing subsystem 532 performs curing on NIL material under imprint, such as the NIL material 202. The multi-group curing subsystem 532 is capable of using multiple methods to cure the NIL material, such as using UV light of different wavelengths, using thermal energy, and so on. This allows the multi-group curing subsystem 532 to cure a NIL material that has functional groups of different types. Based on instructions from the controller 510, the multi-group curing subsystem 532 may first cure one of the functional groups in the NIL material using the curing method corresponding to that material. For example, if the NIL material is cured using UV light, the multi-group curing subsystem 532 may expose the NIL material to UV light for a duration, intensity, and at a wavelength specified by the type of NIL material used. After imprinting the NIL material, the multi-group curing subsystem 532 may cure the other functional group in the NIL material using the curing method associated with that NIL material. For example, thermal energy may be applied to the NIL material for a duration and intensity specified by that material.

The multi-group curing subsystem 532 may also cross-link the different functional groups within the NIL material, using various catalysts or other reactions which are specified by the types of functional groups contained within the NIL material.

The multi-group curing subsystem 532 detects when curing is complete in the NIL material by the duration and intensity of the curing process, and/or by detecting a change in the NIL material itself, e.g., its opacity to radiation, change in color, resistance to physical forces, change in temperature as heat is applied, and so on. Upon detection of completion of each curing step, the multi-group curing subsystem 532 may transmit a message to the controller 510 indicating completion of the cure.

The plasma ashing subsystem 534 applies oxygen plasma to NIL material which has high inorganic content, e.g., NIL material 402. Based on instructions from the controller 510, the plasma ashing subsystem 534 may place the layer of NIL material in a chamber, and expose the surface of the NIL material to an oxygen plasma (e.g., oxygen gas heated and/or pressurized to a plasma state). The plasma ashing subsystem 534 may apply the oxygen plasma for a specified duration and/or concentration in accordance with instructions from the controller. Subsequent to the application of the oxygen plasma, the plasma ashing subsystem 534 may measure the oxidation layer formed on the NIL material using electron microscopy, X-ray reflectivity, in situ spectroscopic ellipsometry, electrical resistance measurements, and other techniques, to determine overall thickness of the overcoat, uniformity of the overcoat, and so on. If the quality falls below a certain threshold, the plasma ashing subsystem 534 may indicate to the controller 510 to discard the NIL material under imprint and to report an error. Otherwise, the plasma ashing subsystem 534 may remove the NIL material from the chamber and transmit a message to the controller 510 indicating completion of the plasma ashing process.

The NIL post-processing system 550 performs post processing steps on the NIL material after imprinting and after the modification by the NIL material modification system 540, based on instructions from the controller 510. This may include the application of an overcoat, annealing under high temperatures, etching to create additional patterns, orthogonal cross linking of NIL material polymers, oxygen plasma treatment, and so on. For example, the NIL material may be further etched in order to increase the prominence of the imprinted pattern on the NIL material. If the NIL material were of low modulus, this etching process may cause feature shrinkage and other deformities within the imprinted pattern of the NIL material. However, by having a high modulus NIL material, these disadvantages are reduced.

Exemplary Flows

Figure 6:
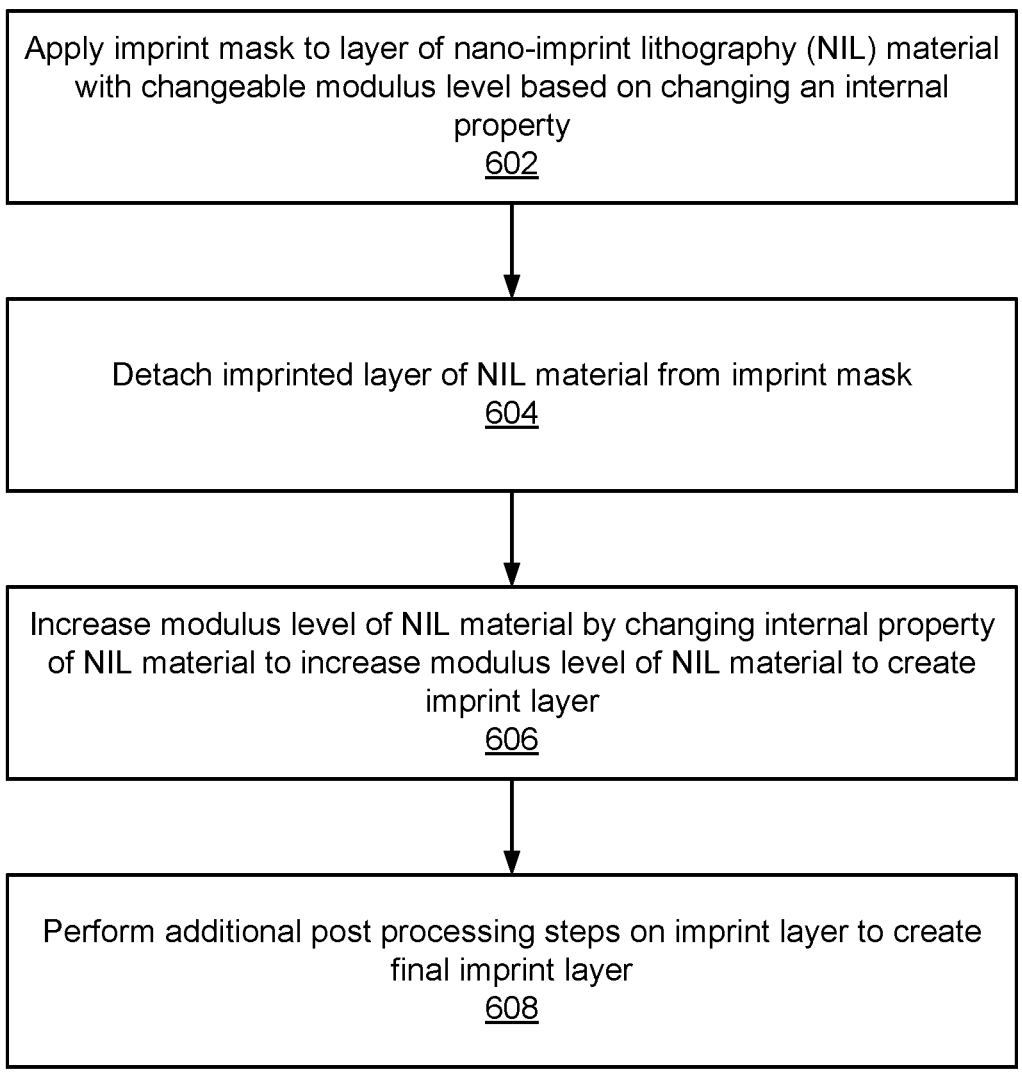
FIG. 6 is a flow chart illustrating a method for NIL with an NIL material having internal properties that can be changed to change the mechanical properties of the NIL material, according to an example embodiment.

FIG. 6 is a flow chart illustrating a method for NIL with an NIL material having internal properties that can be changed to change the mechanical properties of the NIL material, according to an example embodiment. Although the flow chart exhibits a certain order, this is not meant to imply that the process described herein must be performed in this order. The operations described here may be performed by the NIL system 500 of FIG. 5.

The NIL system 500 applies 602 an imprint mask, such as mask 104, to a layer of NIL material, such as NIL material 102, to create an imprinted layer of NIL material. The NIL material has a modulus level that is below a flexibility threshold. The NIL material layer may also have an internal property, that when changed, causes a change in the modulus level of the NIL material.

The NIL system 500 detaches 604 the imprinted layer of NIL material from the imprint mask. As the modulus level of the NIL material is below the flexibility threshold, the shape of the imprinted NIL material layer remains unchanged after detachment.

The NIL system 500 increases 606 a modulus level of the NIL material of the imprinted layer of NIL material beyond a strength threshold to create an imprint layer. The increase is effected by changing the internal property of the NIL material. For example, by applying a second cure to cure a second set of functional groups in the NIL material, or by removing the physical forces to cause the sacrificial bonds in the NIL material to reset. The imprint layer has a structure that remains unaffected by subsequent post-processing steps. The strength threshold may be the high modulus threshold value described above.

The NIL system 500 performs 608 additional post-processing steps on the imprint layer to create the completed imprint layer.

The foregoing description of the embodiments has been presented for the purpose of illustration; it is not intended to be exhaustive or to limit the embodiments to the precise forms disclosed. Many modifications and variations are possible in light of the above disclosure.

Finally, the language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

What is claimed is:

1. A method, comprising:
providing a nano-imprint lithography (NIL) material comprising a first functional group curable via a first curing process and a second functional group curable via a second curing process, the NIL material having an initial modulus level;
applying an imprint mask to a layer of the NIL material to form an imprinted layer, the imprinted layer formed with a pattern;
partially curing the NIL material in the imprinted layer by performing the first curing process to cure the first functional group of the NIL material while the imprint mask is applied to the imprinted layer, wherein the initial modulus level of the NIL material increases to a first modulus level after the first curing process;
detaching the imprinted layer from the imprint mask, the first modulus level of the NIL material causing the pattern of the imprinted layer to remain unchanged after detachment; and after the imprinted layer is detached from the imprint mask, fully curing the NIL material in the imprinted layer by performing the second curing process to cure the second functional group of the NIL material and to form a fully cured imprinted layer, wherein the first modulus level of the NIL material increases to a second modulus level after the second curing process, wherein the second curing process yields orthogonal cross linking of the first functional group and the second functional group in the NIL material, wherein the fully cured imprinted layer has the pattern, and wherein the pattern is an inverse of a pattern of the imprint mask.

2. The method of claim 1, wherein the first curing process is an ultraviolet (UV) light curing process, and wherein the second curing process is a thermal curing process.

3. The method of claim 1, wherein the first functional group is one of acrylates, methacrylates, epoxides, vinyl ethers, and thiols in combination with alkene groups.

4. The method of claim 1, wherein the second functional group is one of acrylates, methacrylates, epoxides, vinyl ethers, thiols in combination with alkene groups, photodimerizing groups including one of cinnamates and coumarin, and thermally dimerizing groups including one of Diels-Alder adducts and cyclopentadiene-alkyne group.

5. The method of claim 1, wherein the pattern of the imprint mask is a three-dimensional slanted pattern.

6. The method of claim 1, further comprising:
over-coating, annealing, etching, or plasma processing the fully cured imprinted layer.

* * * * *